(12) United States Patent
Rastogi et al.

(10) Patent No.: US 9,607,843 B2
(45) Date of Patent: Mar. 28, 2017

(54) METHOD FOR ROUGHNESS IMPROVEMENT AND SELECTIVITY ENHANCEMENT DURING ARC LAYER ETCH VIA ADJUSTMENT OF CARBON-FLUORINE CONTENT

(71) Applicant: Tokyo Electron Limited, Minato-ku, Tokyo (JP)

(72) Inventors: Vinayak Rastogi, Albany, NY (US); Alok Ranjan, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 27 days.

(21) Appl. No.: 14/751,643

(22) Filed: Jun. 26, 2015

(65) Prior Publication Data
US 2016/0240383 A1 Aug. 18, 2016

Related U.S. Application Data

(60) Provisional application No. 62/115,969, filed on Feb. 13, 2015.

(51) Int. Cl.
*H01L 21/66* (2006.01)
*H01L 21/30* (2006.01)
*H01L 21/02* (2006.01)

(52) U.S. Cl.
CPC .... *H01L 21/3003* (2013.01); *H01L 21/02381* (2013.01); *H01L 22/12* (2013.01)

(58) Field of Classification Search
CPC ... H01L 21/3003; H01L 21/02381; H01L 22/12
USPC .......................................... 438/14, 710, 714
See application file for complete search history.

(56) References Cited

U.S. PATENT DOCUMENTS

| | | |
|---|---|---|
| 7,858,270 B2 | 12/2010 | Stamper |
| 8,236,700 B2 | 8/2012 | Cole et al. |
| 2007/0224829 A1* | 9/2007 | Ji ..................... H01L 21/31116 438/710 |
| 2013/0224960 A1* | 8/2013 | Payyapilly ........ H01J 37/32146 438/714 |
| 2014/0134759 A1* | 5/2014 | Lin ..................... H01L 21/0337 438/14 |

* cited by examiner

*Primary Examiner* — Kevin M Picardat
(74) *Attorney, Agent, or Firm* — Wood, Herron & Evans, LLP

(57) ABSTRACT

A method of patterning a silicon containing ARC (anti-reflective coating) layer underlying a patterned layer is described that includes establishing a flow of a process gas to a plasma processing system, selecting a process condition that increases an etch selectivity of the silicon containing ARC layer relative to the patterned layer, igniting plasma from the process gas using a plasma source in accordance with the process condition, and exposing the substrate to the plasma to extend the feature pattern of the patterned layer into the silicon containing ARC layer. The composition of the process gas and the flow rate(s) of the gaseous constituents in the process gas are selected to adjust the carbon-fluorine content.

20 Claims, 11 Drawing Sheets

METHOD FOR ROUGHNESS IMPROVEMENT AND SELECTIVITY ENHANCEMENT DURING ARC LAYER ETCH VIA ADJUSTMENT OF CARBON-FLUORINE CONTENT

CROSS-REFERENCE TO RELATED APPLICATIONS

Pursuant to 37 C.F.R. §1.78(a)(4), this application claims the benefit of and priority to U.S. Provisional Application No. 62/115,969 filed on Feb. 13, 2015 which is expressly incorporated by reference herein in its entirety.

FIELD OF INVENTION

The invention relates to a method for patterning a thin film, and more specifically, to a method for patterning a silicon containing anti-reflective coating (ARC).

DESCRIPTION OF RELATED ART

The need to remain competitive in cost and performance in the production of semiconductor devices elevates demand to continually increase the device density of integrated circuits. And, to achieve higher degrees of integration with the miniaturization in semiconductor integrated circuitry, robust methodologies are required to reduce the scale of the circuit pattern formed on the semiconductor substrate. These trends and requirements impose ever-increasing challenges on the ability to transfer the circuit pattern from one layer to another layer.

Photolithography is a mainstay technique used to manufacture semiconductor integrated circuitry by transferring geometric shapes and patterns on a mask to the surface of a semiconductor wafer. In principle, a light sensitive material is exposed to patterned light to alter its solubility in a developing solution. Once imaged and developed, the portion of the light sensitive material that is soluble in the developing chemistry is removed, and the circuit pattern remains.

Furthermore, to advance optical lithography, as well as accommodate the deficiencies thereof, continual strides are being made to establish alternative patterning strategies to equip the semiconductor manufacturing industry for sub-30 nm technology nodes. Optical Lithography (193i) in conjunction with multiple patterning, EUV (Extreme Ultraviolet) Lithography, and DSA (Direct Self Assembly) Patterning are considered to be some of the promising candidates that are being evaluated to meet the rising demands for aggressive patterning. However, the aforementioned methodologies, present their own set of challenges, which manifest as issues with low resist budget', 'incoming defectivity', 'mask shape', 'critical dimension control', 'line edge roughness (LER)', and 'line width roughness (LWR)' at ever decreasing features sizes.

SUMMARY OF THE INVENTION

Embodiments of the invention relate to a method for patterning a thin film, and more specifically, to a method for patterning a silicon containing anti-reflective coating (ARC).

According to one embodiment, a method of patterning a silicon containing ARC (anti-reflective coating) layer underlying a patterned layer defining an open feature pattern is described that includes establishing a flow of a process gas to a plasma processing system, selecting a process condition that increases an etch selectivity of the silicon containing ARC layer relative to the patterned layer, igniting plasma from the process gas using a plasma source in accordance with the process condition, and exposing the substrate to the plasma to extend the open feature pattern of the patterned layer into the silicon containing ARC layer.

DETAILED DESCRIPTION OF SEVERAL EMBODIMENTS

Figure 1A:
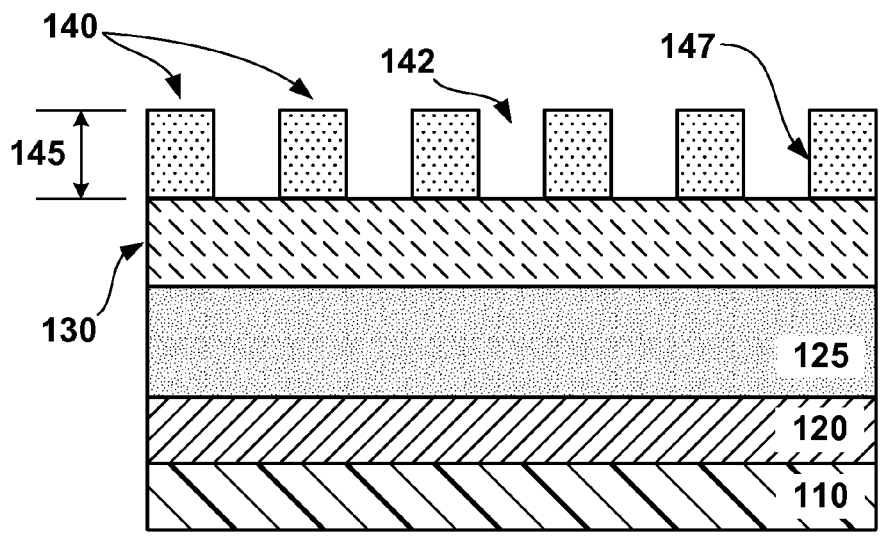
FIGS. 1A and 1B illustrate a method of patterning a layer on a substrate.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As noted above, advanced methodologies are required to address the challenges and meet the demands for aggressive patterning at sub 30 nm technology nodes. And, as also noted, these methodologies present their own set of challenges, which manifest as issues with low resist budget', 'incoming defectivity', 'mask shape', 'critical dimension control', 'line edge roughness (LER)', and 'line width roughness (LWR)' at ever decreasing features sizes. The ability to successfully integrate initial patterning schemes, i.e., lithography, DSA, etc., with etching techniques is paramount to robust pattern transfer.

As an example, once the circuit pattern is initially formed, the patterned material, whether it be a photosensitive material patterned using optical lithography, a mechanically imprinted patterned layer, or direct self-assembled layer, among other things, serves as a protective layer that masks some regions of the semiconductor substrate, while other regions are exposed to permit transfer of the circuit pattern to an underlying layer utilizing a dry etching process, such as a plasma etch process. In order to produce thinner features in the initial patterned layer, multi-layer schemes can be implemented, including bi-layer masks or tri-layer masks. With the inclusion of a second or third layer, the uppermost patterned layer may be thinner than the thickness customarily chosen to withstand the subsequent dry etching process (es). Therefore, the demands placed upon subsequent dry etching techniques are elevated.

In a plasma etch process, the semiconductor substrate is exposed to an etching chemistry that selectively removes the underlying layer while minimally removing the protective layer. This etch chemistry derives from an ionizable, dissociative gas mixture having atomic/molecular constituents capable of favorable reaction with the underlying layer while minimizing less favorable reaction with the protective layer. In the presence of plasma, the etch chemistry is formed through the interaction, e.g., collisions, of its atomic/ molecular constituents with energetic electrons, of which some collisions are dissociative collisions and others are ionizing collisions, for example. Via complex mechanisms, the plasma is manipulated to achieve acceptable values for several inter-related etch metrics, including etch selectivity, etch rate, profile, etc. And, as noted above with ever-decreasing pattern scale, the ability to selectively remove one material relative to another, while satisfactorily meeting other pattern metrics (e.g., roughness, defectivity, etc.), becomes only more critical to robust pattern transfer. Notably, the etch selectivity of subsequent dry etching processes must preserve the lithographic layer to allow full pattern transfer to underlying layers. Furthermore, while etch selectivity is critical, the pattern integrity (e.g., roughness, defectivity, etc.) must be maintained, and more preferably, improved.

Figure 2:
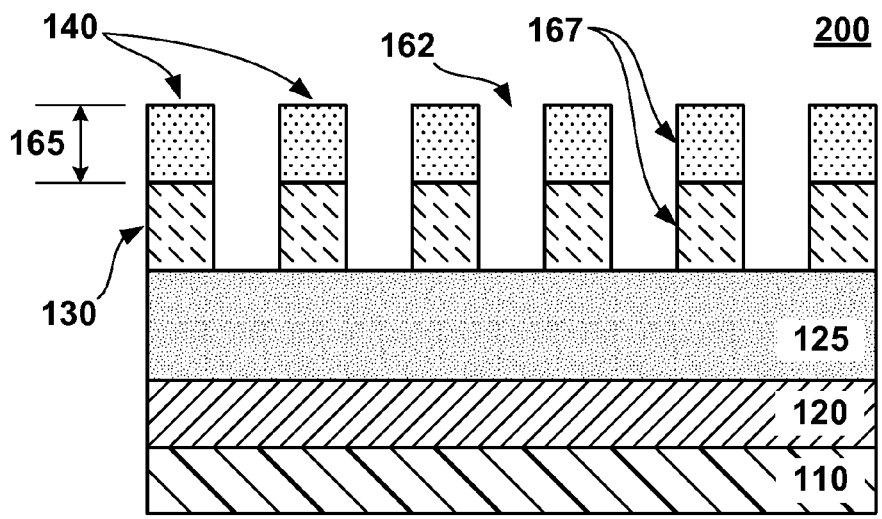
FIG. 2 illustrates a method of patterning a layer on a substrate according to an embodiment.
Figure 3:
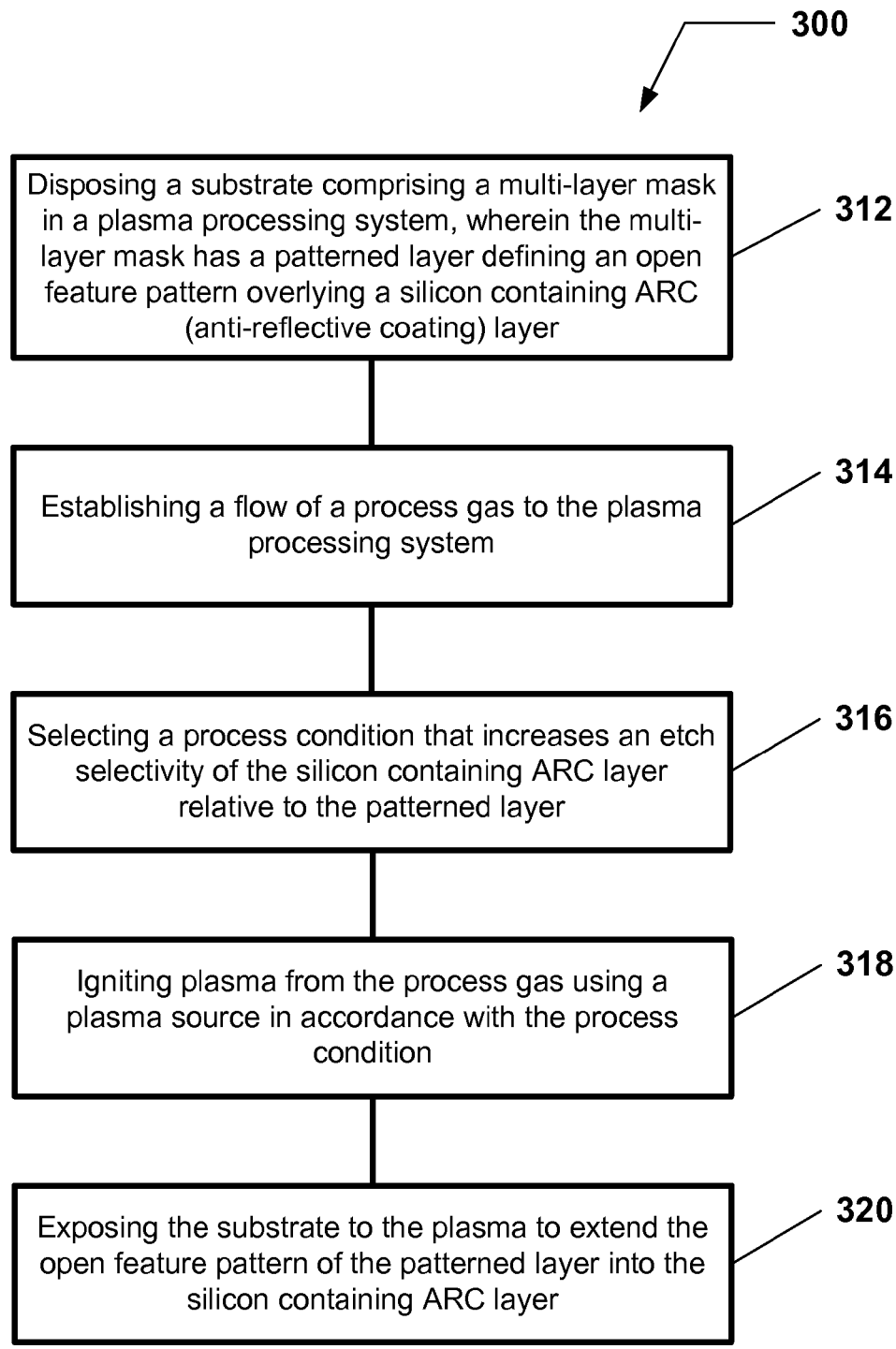
FIG. 3 provides a flow chart illustrating a method of patterning a layer on a substrate according to an embodiment.

Referring now to the drawings, wherein like reference numerals designate identical or corresponding parts throughout the several views, FIGS. 1A, 2, and 3 illustrate a method for patterning a substrate according to an embodiment. The method is pictorially illustrated in FIGS. 1A and 2, and presented by way of a flow chart 300 in FIG. 3. As presented in FIG. 3, the flow chart 300 begins in 312 with disposing a substrate 110 comprising a multi-layer mask in a plasma processing system, wherein the multi-layer mask has a patterned layer 140, defining a first open feature pattern 142, overlying a silicon containing ARC (anti-reflective coating) layer 130. Substrate 110 further includes device layers 120, 125. The device layers 120, 125 can include any thin film or structure on substrate 110 into which a pattern is to be transferred.

The substrate 110 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate. The device layers 120, 125 can include any film or device structure into which a pattern can be transferred.

In one embodiment, the patterned layer 140 can be prepared by spin-coating the substrate 110 with a thin film of photo-sensitive material and patterning the thin film using a lithographic process. For example, the patterned layer 140 can include a photo-resist, such as a 248 nm (nanometer) resist, a 193 nm resist, a 157 nm resist, an EUV (extreme ultraviolet) resist, an electron beam sensitive resist, or any type of thermal freeze photo-resist, electromagnetic (EM) radiation freeze photo-resist, or chemical freeze photo-resist.

During the lithographic process, spin-coating the substrate 110 with a thin layer of photo-sensitive material can be performed in a track system. For example, the track system can include a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The spin-coating process can be followed by one or more first post-application bakes (PAB) to heat the substrate 110 and one or more cooling cycles, following the one or more first PABs, to cool the substrate 110.

Thereafter, the photo-sensitive material can be imaged in a radiation exposure system and developed in a developing system to produce the first open feature pattern 142. The radiation exposure system may include a dry or wet photo-lithography system, including any suitable stepping/scanning lithography system. For example, the photo-lithography system may be commercially available from Nikon Corporation, ASML Netherlands B.V., or Canon, Inc. Alternatively, the first image pattern may be formed using an electron beam lithography system. The developing system can be located on the track system described above. The developing process may be preceded by one or more first post-exposure bakes (PEB) to heat the substrate 110 and one or more cooling cycles, following the one or more first PEBs, to cool the substrate 110.

In another embodiment, the patterned layer 140 can be prepared using a direct self-assembly (DSA) technique. Therein, a block copolymer is applied to substrate 110, and a self-assembled block copolymer layer is formed which is composed of materials that self-organize in a desired and predictable manner to achieve the first and second domains, e.g., the polymer blocks are immiscible and will segregate under appropriate conditions to form domains predominantly containing a single block species. Upon completion of phase segregation, one domain is selectively removed to create the patterned layer 140.

The block copolymer may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure and the carrier solvent subsequently removed to provide the block copolymer. While the invention is not bound by theory, it will be appreciated that the different block species are understood to self-aggregate due to thermodynamic considerations in a process similar to the domain separation of materials. The self-organization is guided by the physical interfaces of the underlying layers, as well as the chemical affinity between the chemical species of the underlying layer of material and at least one of the polymer blocks within the block copolymer chain. Accordingly, the constituent blocks of the block copolymers can orient themselves on substrate 110 due to these interfacial interactions and chemical affinities.

In other embodiments, the patterned layer 140 is formed using any of the aforementioned techniques in combination with a multi-patterning scheme. For example, patterned layer 140 can be formed using LLE (Litho-Litho-Etch), LFLE (Litho-Freeze-Litho-Etch), or LELE (Litho-Etch-Litho-Etch) double and quad patterning schemes. Additionally, for example, patterned layer 140 can be the result of a sidewall image transfer (SIT) double or quad patterning scheme.

The silicon containing ARC layer 130 can also be prepared by spin-coating the substrate 110 with a thin film of material prior to applying materials for creating the patterned layer 140. The silicon content in the silicon containing ARC layer 130 can be varied. For example, in some embodiments, the silicon content can be less than 40%, or 30%, or even 20%. And, in other embodiments, the silicon content can be greater than 40%.

Figure 1B:
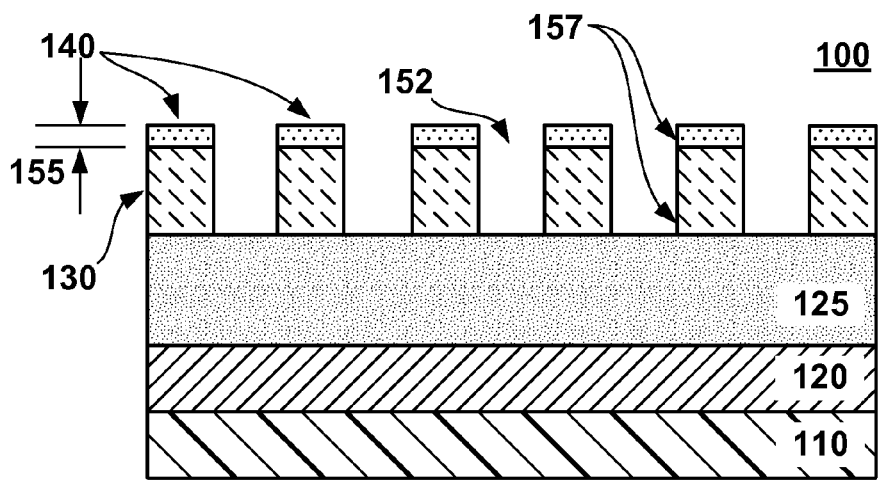

The patterned layer 140, which defines the first open feature pattern 142, can be characterized by a first thickness 145 and first roughness 147 (e.g., line edge roughness, LER, or line width roughness, LWR). As shown in FIG. 1B, when using a conventional etching process to transfer the open feature pattern 142 of the patterned layer 140 into the silicon containing ARC layer 130 to form a second open feature pattern 152, a deficient mask condition 100 is observed. Notable observations include a second thickness 155 of the remaining patterned layer 140 being of insufficient thickness to fully transfer open feature pattern 147 into the silicon containing ARC layer 130 and underlying device layers 120, 125. Other notable observations includes a second roughness 157 that exceeds the first roughness 147, i.e., worsens the integrity of open feature patterns 142, 152.

Therefore, according to several embodiments, a plasma etch process is described that remedies some or all of the above noted deficiencies. The plasma etch process modulates passivation during the etching of the underlying silicon containing ARC layer, thereby enhancing the etch selectivity relative to the patterned layer 140, e.g., etch selectivity relative to photoresist or other organic materials, and improving pattern roughness manifested in the form of LER/LWR. The passivation species can form a thin protection on the patterned layer 140, and thus, provide increased etch resistance during the etching of the silicon containing ARC layer 130. The line edge roughness and line width roughness can also be improved as a result of the formation of a passivation layer which smooths the exposed surface.

According to one embodiment, as shown in FIG. 2, the open feature pattern 142 of the patterned layer 140 is transferred into the silicon containing ARC layer 130 to form a second open feature pattern 162 using a plasma etch process. The plasma etch process begins in 314 with establishing a flow of a process gas to the plasma processing system.

Then, in 316, a process condition for the plasma etch process is selected that increases an etch selectivity of the silicon containing ARC layer 130 and the patterned layer 140.

Thereafter, in 318, plasma is ignited from the process gas using a plasma source in accordance with the process condition, and in 320, the substrate 110 is exposed to the plasma to extend the feature pattern 142 of the patterned layer 140 into the silicon containing ARC layer 130.

According to one embodiment, the process gas contains a first gaseous molecular constituent composed of C, F and optionally H, and having a carbon-to-fluorine ratio of 1-to-4, and a second gaseous molecular constituent composed of C, F, and optionally H, and having a carbon-to-fluorine ratio of 1-to-3. And, the process condition for the plasma etch process is selected that adjusts the C—F molecular ratio to increase the etch selectivity, measured as the ratio of the etch rate of the silicon containing ARC layer 130 to the etch rate of the patterned layer 140, to a value that exceeds 5-to-1 by selecting a ratio of the flow rate of the first gaseous molecular constituent to the flow rate of the second gaseous molecular constituent greater than or equal to 0.5 and less than 2.5, or greater than or equal to 0.5 and less than 1.5.

TABLE 1

| Process Condition | $CF_4:CHF_3$ | CD (nm) | ER (nm) | LWR (nm) | E.S. |
|---|---|---|---|---|---|
| A | 1.89:1 | 16.42 | 2.24 | 3.32 | 1.18 |
| B | 1:1 | 14.26 | 2.09 | 3.03 | 1.96 |

In one example, the first gaseous molecular constituent includes a $C_xF_y$-containing gas (wherein x and y are real numbers greater than zero, and x/y=1/4), such as $CF_4$, and the second gaseous molecular constituent includes a $C_xH_yF_z$-containing gas (wherein x, y and z are real numbers greater than zero, and x/z=1/3), such as $CHF_3$. The ratio of the $CF_4$ flow rate to the $CHF_3$ flow rate can range from 0.5 to 2.0, and preferably, from 0.8 to 1.2. Alternatively, the molecular ratio of carbon-to-fluorine for the combined flows of the process gas can range from 0.274 to 0.300.

Table 1 provides two exemplary process conditions, namely A and B, wherein the flow ratio of $CF_4$ to $CHF_3$ is varied from 1.89 to 1.00. The line CD is slightly decreased, while the LER and LWR are reduced by 10%, and the etch selectivity (E.S.) is increased by 66%. The data in Table 1 was obtained from cross-sectional SEM (scanning electron microscope) and top down SEM measurements, which clearly shows the effect of passivation species modulation on selectivity enhancement and pattern roughness reduction during underlying silicon containing ARC layer etch. Furthermore, the patterned layer 140 can have an open feature pattern 142 characterized by a first critical dimension (CD), wherein a difference between a second CD measured at a bottom of the open feature pattern 162 formed in the silicon containing ARC layer 130 and the first CD is less than 20% of the first CD. Table 2 provides the corresponding molecular ratios for exemplary flow rates that satisfy the flow ratios of Table 1.

TABLE 2

| Flow Rate (sccm) | | Molecular Ratio | | |
|---|---|---|---|---|
| $CF_4$ | $CHF_3$ | C:H | C:F | H:F |
| 85 | 45 | 2.8889 | 0.2737 | 0.0947 |
| 65 | 65 | 2.0000 | 0.2857 | 0.1429 |

Figure 4A:
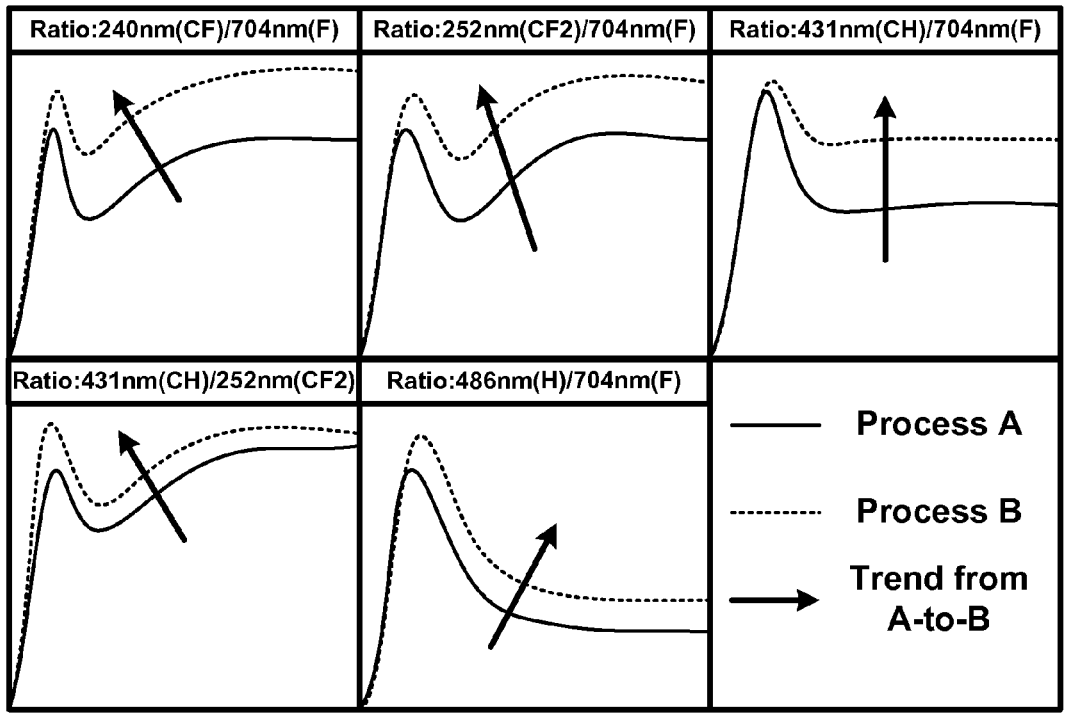
FIGS. 4A through 4C provide exemplary data regarding the adjustment of etch chemistry for patterning a layer on a substrate according to various embodiments.

The results of Table 1 were obtained by performing the plasma etch process in a capacitively coupled plasma (CCP) reactor, such as the one to be described with reference to FIG. 7. Furthermore, using optical emission spectroscopy (OES), optical emission spectra were obtained during the plasma etch process to observe trends in the ratios of $CF_x$, F and $CH_x$ species in the plasma. As shown in FIG. 4A, the adjustment of the flow ratio of the first molecular constituent to the second molecular constituent (see Table 1) caused an increase in the CF/F, $CF_2$/F, CH/F, CH/$CF_2$, and H/F content.

The process gas can further include a third gaseous molecular constituent composed of atomic hydrogen, diatomic hydrogen, or C and an element selected from the group consisting of H and F, wherein the carbon-to-fluorine ratio of the third gaseous molecular constituent is greater than the maximum carbon-to-fluorine ratio of the first and second gaseous molecular constituents. For example, the third gaseous molecular constituent can include a $C_xF_y$-containing gas, wherein x and y represent a real number greater than 0, and wherein the ratio x/y exceeds the C-to-F ratio of the first and the second gaseous molecular constituents. The third gaseous molecular constituent can include $C_4F_8$.

TABLE 3

| Process Condition | $CF_4$:$CHF_3$ | $C_4F_8$ Molar Ratio | CD (nm) | LER (nm) | LWR (nm) | E.S. |
|---|---|---|---|---|---|---|
| Post-Litho/Initial | N/A | N/A | 16.2 | 2.97 | 4.3 | N/A |
| a | 1.89:1 | 0.000 | 13.93 | 2.41 | 3.54 | 1.4 |
| b | 1.89:1 | 0.040 | 12.95 | 2.21 | 3.14 | 18 |
| c | 1.89:1 | 0.070 | 12.34 | 2.29 | 3.14 | Infinite |
| d | 1.89:1 | 0.100 | 12.59 | 2.34 | 3.32 | Infinite |

Table 3 provides four exemplary process conditions, namely a through d, wherein the flow ratio of $CF_4$ to $CHF_3$ is set to 1.89, and the $C_4F_8$ molar ratio is varied. The line CD is slightly decreased in some cases, while the LER and LWR are reduced for moderate molar ratios, and the etch selectivity (E.S.) is increased to infinite (deposition condition on patterned layer 140). The results of the plasma etch process can be compared with the Post-Litho/Initial condition (i.e., CD and roughness). However, the inventors have observed that a moderate molar ratios, e.g., 0.040, produces high etch selectivity and low roughness. The data in Table 3 was obtained from cross-sectional SEM (scanning electron microscope) and top down SEM measurements, which clearly shows the effect of passivation species modulation on selectivity enhancement and pattern roughness reduction during underlying silicon containing ARC layer etch. The $C_4F_8$ molar ratio can range up to 0.100, and preferably up to 0.050. Furthermore, the patterned layer 140 can have an open feature pattern 142 characterized by a first critical dimension (CD), wherein a difference between a second CD measured at a bottom of the open feature pattern 162 formed in the silicon containing ARC layer 130 and the first CD is less than 20% of the first CD.

Table 4 provides the molecular ratios for the exemplary flow rates of Process A with and without the addition of $C_4F_8$. The molecular ratio of carbon-to-fluorine for the combined flows of the process gas ranges from 0.270 to 0.300, and preferably between 0.274 and 0.300.

TABLE 4

| Flow Rate (sccm) | | | Molecular Ratio | | |
|---|---|---|---|---|---|
| $CF_4$ | $CHF_3$ | $C_4F_8$ | C:H | C:F | H:F |
| 85 | 45 | 0 | 2.8889 | 0.2737 | 0.0947 |
| 85 | 45 | 5 | 3.3333 | 0.2913 | 0.0874 |

Alternatively, for example, the third gaseous molecular constituent can include a $C_xH_y$-containing gas, wherein x and y represent a real number greater than 0, and wherein the ratio y/x exceeds the H-to-C ratio of the first and the second gaseous molecular constituents. The $C_xH_y$-containing gas can include $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof.

The introducing of the second gaseous molecular constituent (or the first molecular constituent, or the third molecular constituent) can be modulated, e.g., pulse modulated. Alternatively, any of the ratios of the flow rate of the first gaseous molecular constituent, the second gaseous molecular constituent, and the third gaseous molecular constituent can be modulated. A process condition for the flow rate modulating and controlling of a profile of the second open feature pattern 162 formed within the silicon containing ARC layer 130 can be selected that includes: setting a pulse amplitude, a pulse frequency, a pulse duty cycle, or a pulse waveform, or any combination thereof. As an example, the pulse modulating can include pulsing the flow rate of the second gaseous molecular constituent between an off-state and an on-state.

According to another embodiment, the process gas contains a first gaseous molecular constituent composed of C, F and optionally H, a second gaseous molecular constituent composed of C, F, and optionally H, the second gaseous molecular constituent having a different carbon-to-fluorine ratio than the first gaseous molecular constituent, and a third gaseous molecular constituent composed of C and an element selected from the group consisting of H and F, wherein the carbon-to-fluorine ratio of the third gaseous molecular constituent is greater than the maximum carbon-to-fluorine ratio of the first and second gaseous molecular constituents. And, the selecting of the process condition for the plasma etch process includes specifying a flow rate for each gaseous molecular constituent that increases an etch selectivity, measured as the ratio of the etch rate of the silicon containing ARC layer to the etch rate of the patterned lithographic layer, relative to a nominal etch selectivity achievable using the process condition while introducing only the first and second gaseous molecular constituents.

In one example, the first gaseous molecular constituent includes a $C_xF_y$-containing gas (wherein x and y are real numbers greater than zero), such as $CF_4$, the second gaseous molecular constituent includes a $C_xH_yF_z$-containing gas (wherein x, y and z are real numbers greater than zero), such as $CHF_3$, and the third gaseous molecular constituent includes a $C_xH_y$-containing gas (wherein x and y represent a real number greater than 0, and wherein the ratio y/x exceeds the H-to-C ratio of the first and the second gaseous molecular constituents), such as $CH_4$. Alternatively, the $C_xH_y$-containing gas can include $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof. The ratio of the $CHF_3$ flow rate to the $CF_4$ flow rate can range from 0 to 2.0. Alternatively, the ratio of the $CF_4$ flow rate to the $CHF_3$ flow rate can range from 0.5 to 1.5, and preferably, from 0.8 to 1.2. Alternatively yet, the molecular ratio of carbon-to-fluorine for the combined flows of the process gas can range from 0.274 to 0.300.

TABLE 5

| Process Condition | $CF_4$:$CHF_3$ | $CH_4$ Molar Ratio | CD (nm) | LER (nm) | LWR (nm) | E.S. |
|---|---|---|---|---|---|---|
| A | 1.89:1 | 0.000 | 16.42 | 2.24 | 3.32 | 1.18 |
| C | 1.89:1 | 0.015 | 14.03 | 2.04 | 2.96 | 13.85 |
| D | 1.89:1 | 0.030 | 12.95 | 2.36 | 3.22 | 6.1 |
| E | 1.89:1 | 0.044 | 12.34 | 2.78 | 3.85 | Heavy Dep. |
| F | 1.89:1 | 0.058 | 12.59 | 3.78 | 5.60 | Etch Stop |

Table 5 provides five exemplary process conditions, namely A through E. Process A is the same process condition as provided in Table 1, i.e., the flow ratio of $CF_4$ to $CHF_3$ is 1.89. For Process conditions C through F, the molar ratio is increased. As evidenced by Table 4, the line CD is slightly decreased, while the LER and LWR are reduced by 10%, and the etch selectivity (E.S.) is increased by an order of magnitude. However, excessive $CH_4$ addition causes substantive deposition, and the etch process fails. The $CH_4$ molar ratio can range up to 0.10, or up to 0.030. The ratio of the flow rate of $CH_4$ to the flow rate of $CF_4$ can range up to 0.10, or up to 0.06, and the ratio of the flow rate of $CH_4$ to the flow rate of $CHF_3$ can range up to 0.20, or up to 0.15.

The data in Table 5 was obtained from cross-sectional SEM (scanning electron microscope) and top down SEM measurements, which clearly shows the effect of passivation species modulation on selectivity enhancement and pattern roughness reduction during underlying silicon containing ARC layer etch. Furthermore, the patterned layer 140 can have an open feature pattern 142 characterized by a first critical dimension (CD), wherein a difference between a second CD measured at a bottom of the open feature pattern 162 formed in the silicon containing ARC layer 130 and the first CD is less than 20% of the first CD. Table 6 provides the corresponding molecular ratios for exemplary flow rates in Process A with and without the addition of 5 sccm (standard cubic centimeters per minute) of $CH_4$. The molecular ratio of carbon-to-fluorine for the combined flows of the process gas ranges from 0.270 to 0.300, and preferably between 0.274 and 0.300.

TABLE 6

| Flow Rate (sccm) | | | Molecular Ratio | | |
|---|---|---|---|---|---|
| $CF_4$ | $CHF_3$ | $CH_4$ | C:H | C:F | H:F |
| 85 | 45 | 0 | 2.8889 | 0.2737 | 0.0947 |
| 85 | 45 | 5 | 3.3333 | 0.2913 | 0.0874 |

Figure 4B:
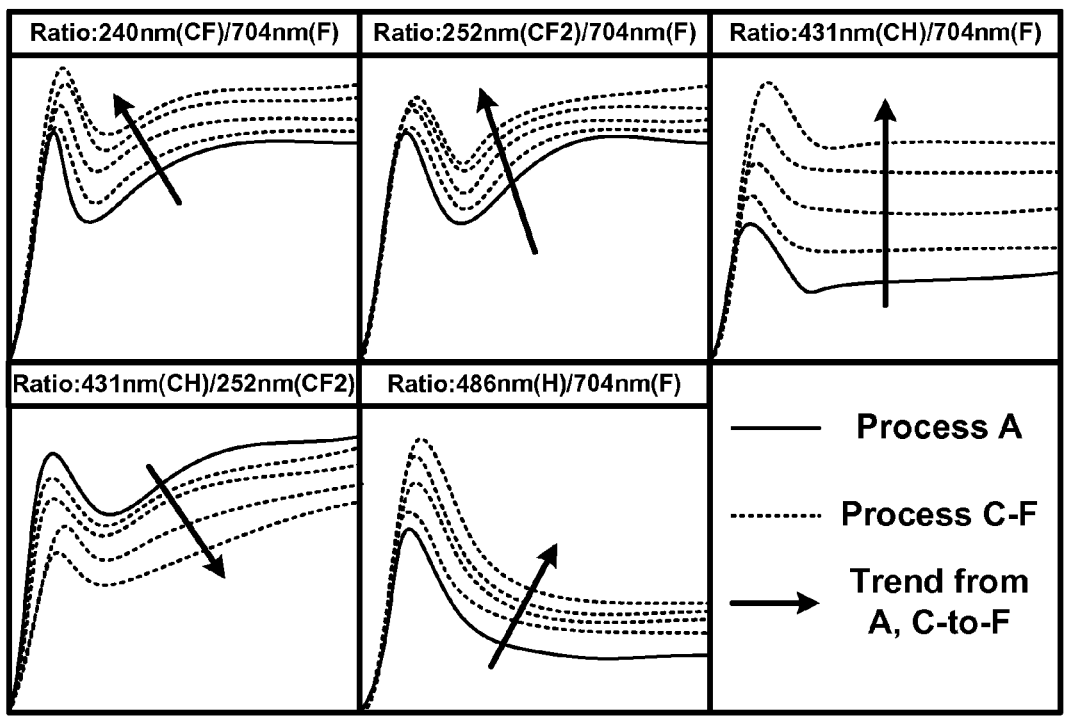

The results of Table 5 were performed in a capacitively coupled plasma (CCP) reactor, such as the one to be described with reference to FIG. 7. Furthermore, using optical emission spectroscopy (OES), optical emission spectra were obtained during the plasma etch to observe trends in the ratios of $CF_x$, F and $CH_x$ species in the plasma. As shown in FIG. 4B, the adjustment of the flow ratio of the first molecular constituent to the second molecular constituent (see Table 5) caused an increase in the CF/F, $CF_2$/F, CH/F, and H/F content, and a decrease in the CH/$CF_2$ content.

The process gas can further include a fourth gaseous molecular constituent composed of atomic hydrogen, diatomic hydrogen, or C and an element selected from the group consisting of H and F, wherein the carbon-to-fluorine ratio of the third gaseous molecular constituent is greater than the maximum carbon-to-fluorine ratio of the first and second gaseous molecular constituents. For example, the fourth gaseous molecular constituent can include a $C_xF_y$-containing gas, wherein x and y represent a real number greater than 0, and wherein the ratio x/y exceeds the C-to-F ratio of the first and the second gaseous molecular constituents. The fourth gaseous molecular constituent can include $C_4F_8$.

The introducing of the third gaseous molecular constituent (or the first molecular constituent, or the second molecular constituent, or the fourth molecular constituent) can be modulated, e.g., pulse modulated. Alternatively, any of the ratios of the flow rate of the first gaseous molecular constituent, the second gaseous molecular constituent, and the third gaseous molecular constituent can be modulated. A process condition for the flow rate modulating and controlling of a profile of the second open feature pattern 162 formed within the silicon containing ARC layer 130 can be selected that includes: setting a pulse amplitude, a pulse frequency, a pulse duty cycle, or a pulse waveform, or any combination thereof. As an example, the pulse modulating can include pulsing the flow rate of the second gaseous molecular constituent between an off-state and an on-state.

According to yet another embodiment, the process gas contains a first gaseous molecular constituent composed of C, F and optionally H, an optional second gaseous molecular constituent composed of C, F, and optionally H, the second gaseous molecular constituent having a different carbon-to-fluorine ratio than the first gaseous molecular constituent, and a third gaseous molecular constituent containing atomic hydrogen, diatomic hydrogen, or a $C_xH_y$-containing gas, wherein x and y are real numbers greater than zero. And, the selecting of the process condition for the plasma etch process includes specifying a flow rate for each molecular constituent that increases an etch selectivity, measured as the ratio of the etch rate of the silicon containing ARC layer to the etch rate of the patterned lithographic layer, relative to a nominal etch selectivity achievable using the process condition while excluding the introducing of the third gaseous molecular constituent.

TABLE 7

| Process Condition | H$_2$ Molar Ratio | CD (nm) | LER (nm) | LWR (nm) | E.S. |
|---|---|---|---|---|---|
| G | 0.030 | 13.87 | 2.19 | 3.15 | 5.45 |
| H | 0.060 | 12.91 | 2.36 | 3.3 | 11.25 |
| I | 0.110 | 13.29 | 2.73 | 3.58 | 1.09 |

In one example, the first gaseous molecular constituent includes a $C_xF_y$-containing gas (wherein x and y are real numbers greater than zero), such as $CF_4$, the optional second gaseous molecular constituent includes a $C_xH_yF_z$-containing gas (wherein x, y and z are real numbers greater than zero), such as $CHF_3$, and the third gaseous molecular constituent includes atomic hydrogen, diatomic hydrogen, or a $C_xH_y$-containing gas (wherein x and y represent a real number greater than 0, and wherein the ratio y/x exceeds the H-to-C ratio of the first and the second gaseous molecular constituents, such as $CH_4$). The third gaseous molecular constituent can include $H_2$. Alternatively, the third gaseous molecular constituent includes $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof. The ratio of the $CF_4$ flow rate to the $CHF_3$ flow rate can range from 0.5 to 1.5, and preferably, from 0.8 to 1.2. Alternatively, the molecular ratio of carbon-to-fluorine for the combined flows of the process gas can range from 0.274 to 0.300.

Table 7 provides three exemplary process conditions, namely G through I. For process conditions G through I, the molar ratio of $H_2$ addition to $CF_4$ is increased. As evidenced by Table 7, the line CD is slightly decreased for some cases, while the LER and LWR are marginally increased (however, reduced from Process A) and the etch selectivity (E.S.) is increased. However, excessive $H_2$ addition causes the etch selectivity to decay substantially. The $H_2$ molar ratio can range up to 0.100. The ratio of the flow rate of $H_2$ to the flow rate of $CF_4$ can range up to 0.20.

TABLE 8

| Flow Rate (sccm) | | | Molecular Ratio | | |
|---|---|---|---|---|---|
| CF$_4$ | CHF$_3$ | H$_2$ | C:H | C:F | H:F |
| 330 | 0 | 0 | 0.0000 | 0.2500 | 0.0000 |
| 330 | 0 | 60 | 2.7500 | 0.2500 | 0.0909 |

The data in Table 7 was obtained from cross-sectional SEM (scanning electron microscope) and top down SEM measurements, which clearly shows the effect of passivation species modulation on selectivity enhancement and pattern roughness reduction during underlying silicon containing ARC layer etch. Furthermore, the patterned layer 140 can have an open feature pattern 142 characterized by a first critical dimension (CD), wherein a difference between a second CD measured at a bottom of the open feature pattern 162 formed in the silicon containing ARC layer 130 and the first CD is less than 20% of the first CD. Table 8 provides the corresponding molecular ratios for exemplary flow rates in Processes G through I with and without the addition of $H_2$. The molecular ratio of carbon-to-fluorine for the combined flows of the process gas can range from 0.270 to 0.300, and preferably between 0.274 and 0.300. The molecular ratio of hydrogen-to-fluorine for the combined flows of the first and second gaseous molecular constituents can range up to 0.10.

Figure 4C:
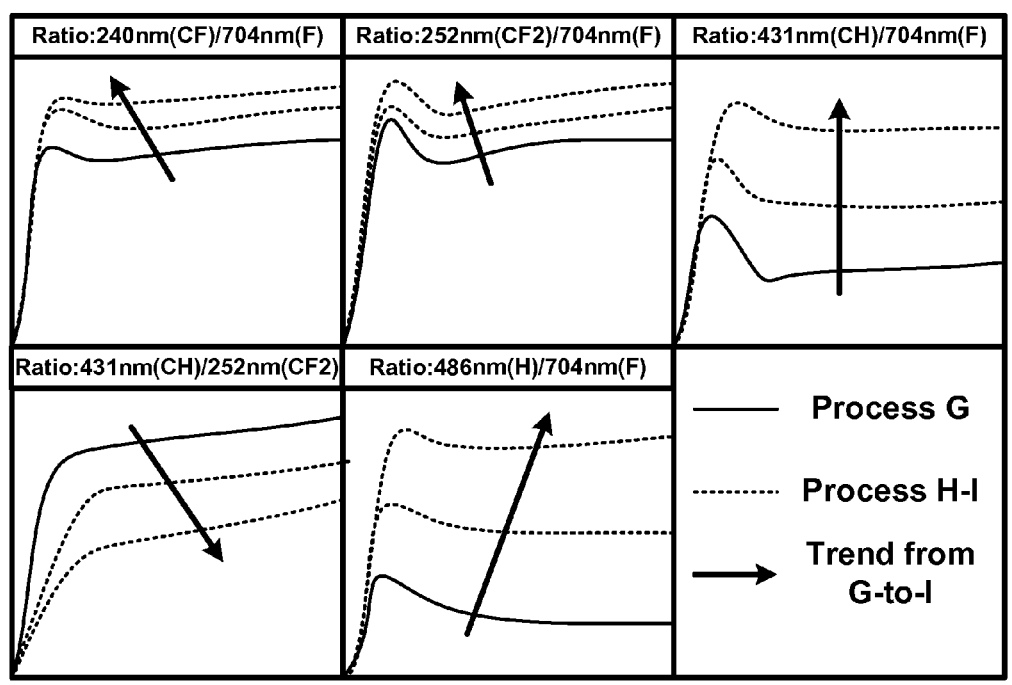

The results of Table 7 were performed in a capacitively coupled plasma (CCP) reactor, such as the one to be described with reference to FIG. 7. Furthermore, using optical emission spectroscopy (OES), optical emission spectra were obtained during the plasma etch to observe trends in the ratios of $CF_x$, F and $CH_x$ species in the plasma. As shown in FIG. 4C, the adjustment of the flow ratio of the first molecular constituent to the second molecular constituent (see Table 7) caused an increase in the CF/F, $CF_2$/F, CH/F, and H/F content, and a decrease in the CH/$CF_2$ content.

The introducing of the third gaseous molecular constituent (or the first molecular constituent, or the second molecular constituent) can be modulated, e.g., pulse modulated. Alternatively, any of the ratios of the flow rate of the first gaseous molecular constituent, the second gaseous molecular constituent, and the third gaseous molecular constituent can be modulated. A process condition for the flow rate modulating and controlling of a profile of the second open feature pattern 162 formed within the silicon containing ARC layer 130 can be selected that includes: setting a pulse amplitude, a pulse frequency, a pulse duty cycle, or a pulse waveform, or any combination thereof. As an example, the pulse modulating can include pulsing the flow rate of the second gaseous molecular constituent between an off-state and an on-state.

The plasma etch process can include electrically biasing a substrate holder that supports the substrate 110 with radio frequency (RF) power, and optionally pulsing the RF power for the electrical biasing. As an example, the plasma etch process may comprise a process parameter space that includes: a chamber pressure ranging up to about 1000 mtorr (millitorr) (e.g., up to about 200 mtorr, or up to about 50 to 150 mtorr), a flow rate of a first gaseous molecular constituent ranging up to about 2000 sccm (standard cubic centimeters per minute) (e.g., up to about 1000 sccm, or about 1 sccm to about 200 sccm), a flow rate of a second gaseous molecular constituent ranging up to about 2000 sccm (e.g., up to about 1000 sccm, or about 1 sccm to about 100 sccm), a flow rate of a third gaseous molecular constituent ranging up to about 2000 sccm (e.g., up to about 1000 sccm, or about 1 sccm to about 100 sccm), an optional noble gas (e.g., He or Ar) flow rate ranging up to about 2000 sccm (e.g., up to about 1000 sccm), an upper electrode (e.g., element 770 in FIG. 7) RF power ranging up to about 2000 W (watts) (e.g., up to about 1000 W, or up to about 600 W), a lower electrode (e.g., element 522 in FIG. 7) RF bias ranging up to about 1000 W (e.g., up to about 600 W, or up to about 100 W, or up to 50 W), an optional lower electrode pulse frequency ranging up to about 1000 Hz (e.g., up to about 100 Hz, or up to about 10 Hz, or up to 1 Hz), and an optional lower electrode pulse duty cycle ranging from about 1:4 (20%-ON/80%-OFF) to about 4:1 (80%-ON/20%-OFF) (e.g., from about 1:2 to about 2:1, or about 1:1 (50%-ON/50%-OFF)). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Flow modulation can be substantially in-phase with the pulsing of RF power (i.e., gas is introduced during RF power on-state). Alternatively, gas flow can be continuous during the pulsing of RF power. Alternatively yet, flow modulation can be substantially out-of-phase with the pulsing of RF power (i.e., gas is introduced during RF power off-state). The flow modulation can be substantially out-of-phase with the pulsing of RF power, yet there may be some overlap. Further, the RF power level (or RF amplitude) may be varied from one pulse to the next pulse. For example, the RF power level may be ramped downward or decreased during the electrical biasing of the substrate.

In one embodiment, the pulsing of RF power for the electrical biasing may include: (i) pulsing the RF power at a first RF power level for a first time duration; (ii) flowing a first gas (first gaseous molecular constituent) continuously, the first gas being a primary etchant; and (iii) flowing a second gas (second gaseous molecular constituent) continuously. In alternative embodiments, the first gas, or the second gas, or both may be pulsed.

In another embodiment, the pulsing of RF power for the electrical biasing may include: (i) pulsing the RF power at a first RF power level for a first time duration; and (ii) pulsing the RF power at a second RF power level for a second time duration, wherein the second RF power level is less than the first RF power level, and the second time duration follows the first time duration. In another embodiment, the pulsing of RF power for the electrical biasing may further include: (iii) pulsing the RF power at a third RF power level for a third time duration, wherein the third RF power level is less than the second RF power level, and the third time duration follows the second time duration. Furthermore, in other embodiments, the pulsing of RF power for the electrical biasing may further include: (iv) flowing a first gas (first gaseous molecular constituent) continuously, the first gas being a primary etchant; and (v) flowing a second gas (second gaseous molecular constituent) continuously, the second gas being a polymerizing or passivating gas. In alternative embodiments, the first gas, or the second gas, or both may be pulsed.

In yet another embodiment, the pulsing of RF power for the electrical biasing may include: (i) pulsing the RF power at a first RF power level for a first time duration; (ii) pulsing the RF power at a second RF power level for a second time duration, wherein the second RF power level is less than the first RF power level, and the second time duration follows the first time duration; and (iii) terminating the pulsing of power for a third time duration, wherein the third time duration follows the second time duration.

In other embodiments, RF power may be supplied to the lower electrode and not the upper electrode. In yet other alternate embodiments, RF power and/or DC power may be coupled in any of the manners described through FIGS. 5 to 11.

The time duration to perform a specific etching process may be determined using design of experiment (DOE) techniques or prior experience; however, it may also be determined using optical detection. One possible method of optical detection is to monitor a portion of the emitted light spectrum from the plasma region that indicates when a change in plasma chemistry occurs due to a change in the etching process. After emission levels corresponding to the monitored wavelengths cross a specified threshold (e.g., decrease below a particular level, or increase above a particular level), a transition point in the etching process can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with transition detection.

Figure 6:
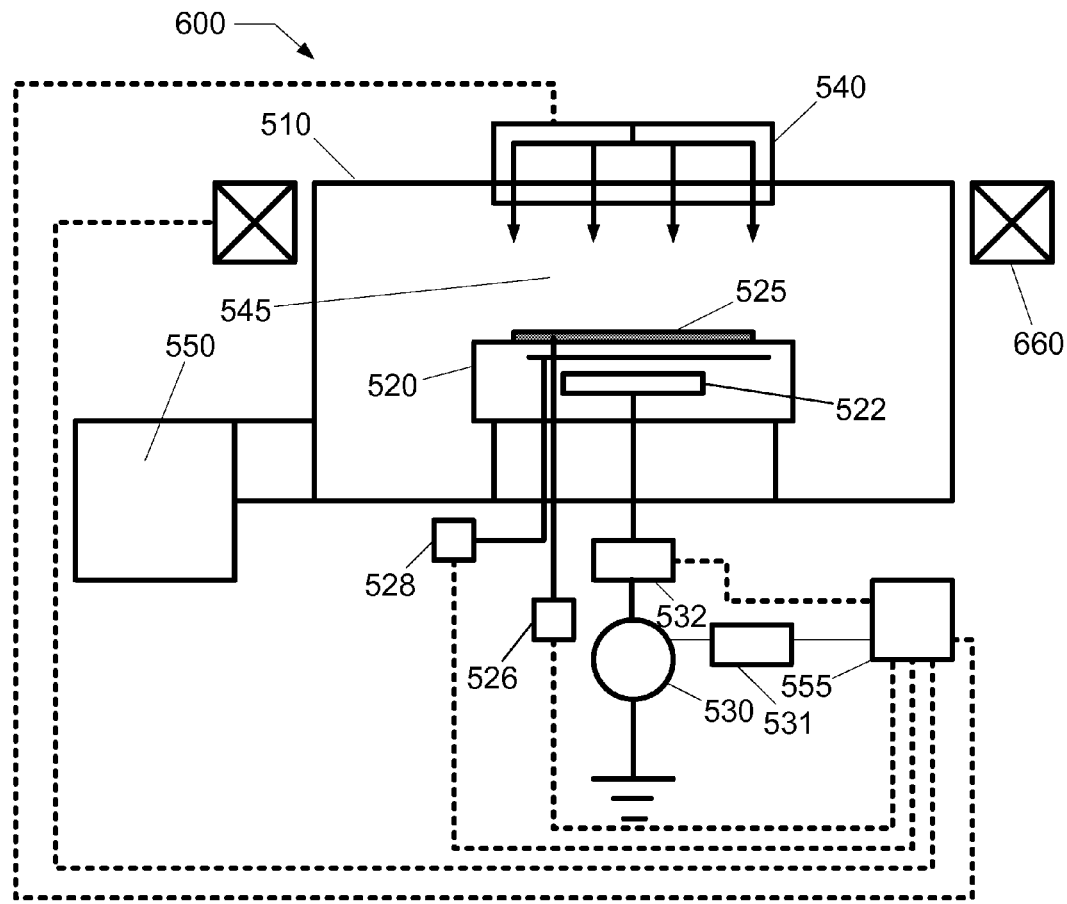
FIG. 6 shows a schematic representation of a plasma processing system according to another embodiment.
Figure 7:
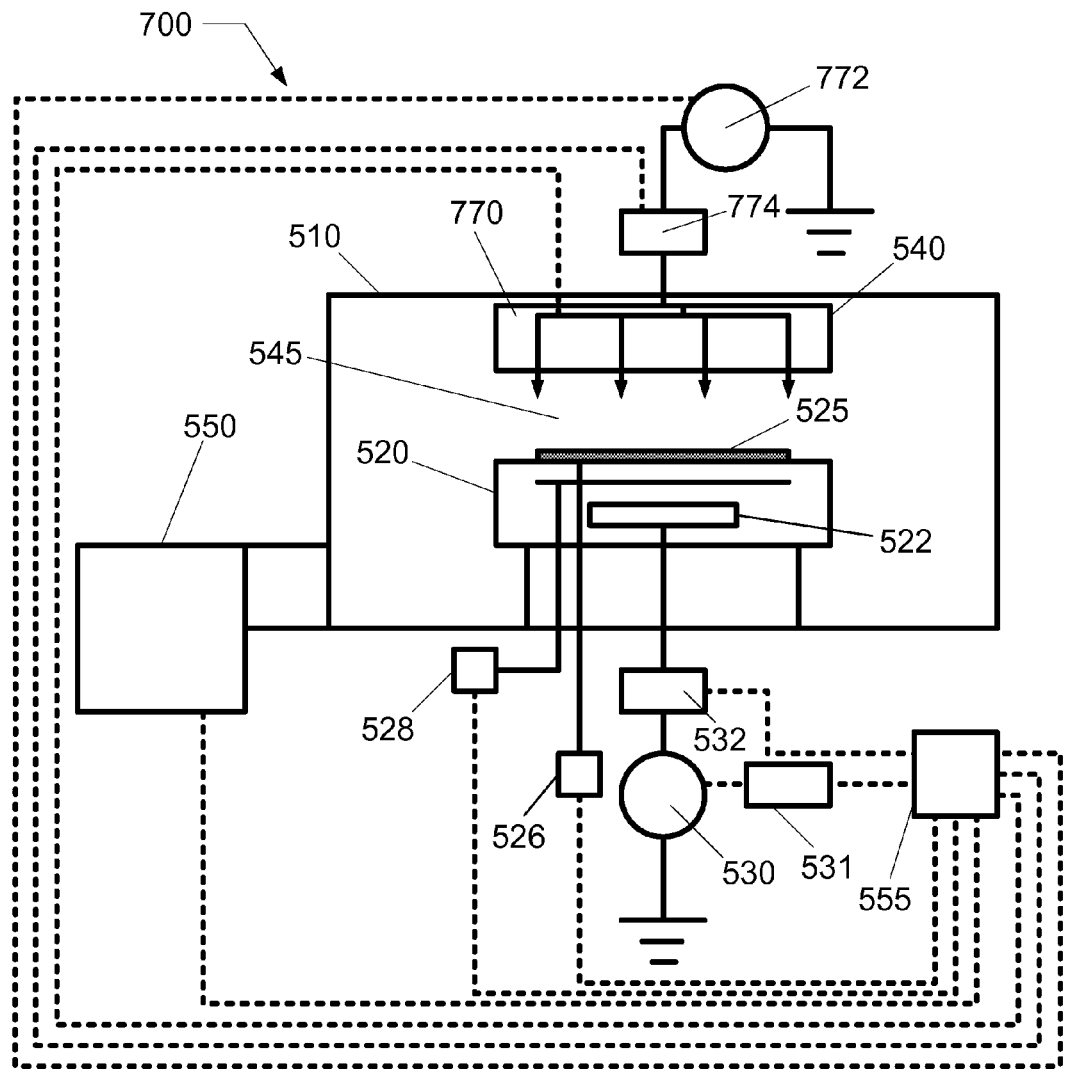
FIG. 7 shows a schematic representation of a plasma processing system according to another embodiment.

One or more of the methods for patterning a silicon containing ARC layer described above may be performed utilizing a plasma processing system such as the one described in FIG. 7. However, the methods discussed are not to be limited in scope by this exemplary presentation. The method of patterning a gate stack on a substrate according to various embodiments described above may be performed in any one of the plasma processing systems illustrated in FIGS. 5 through 11 and described below.

Figure 5:
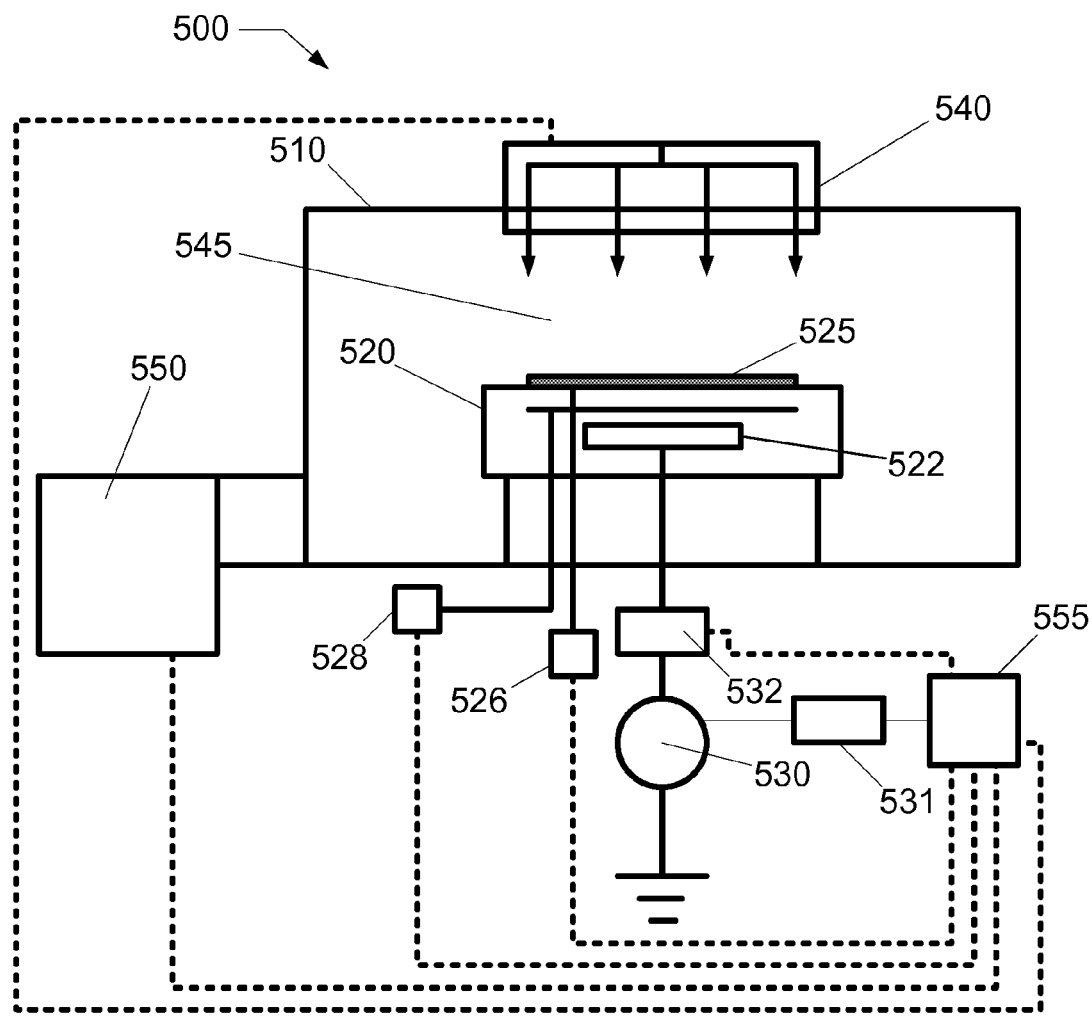
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein a helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
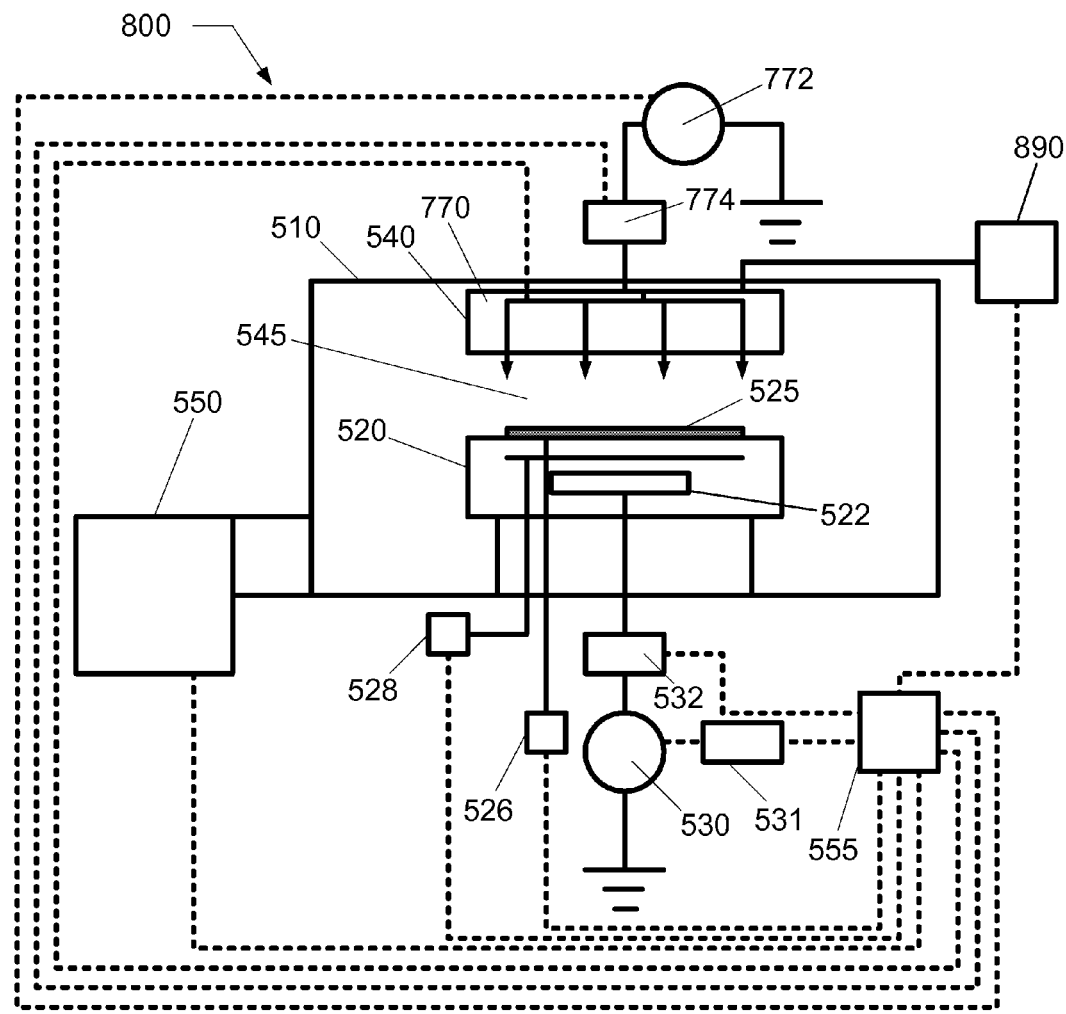
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
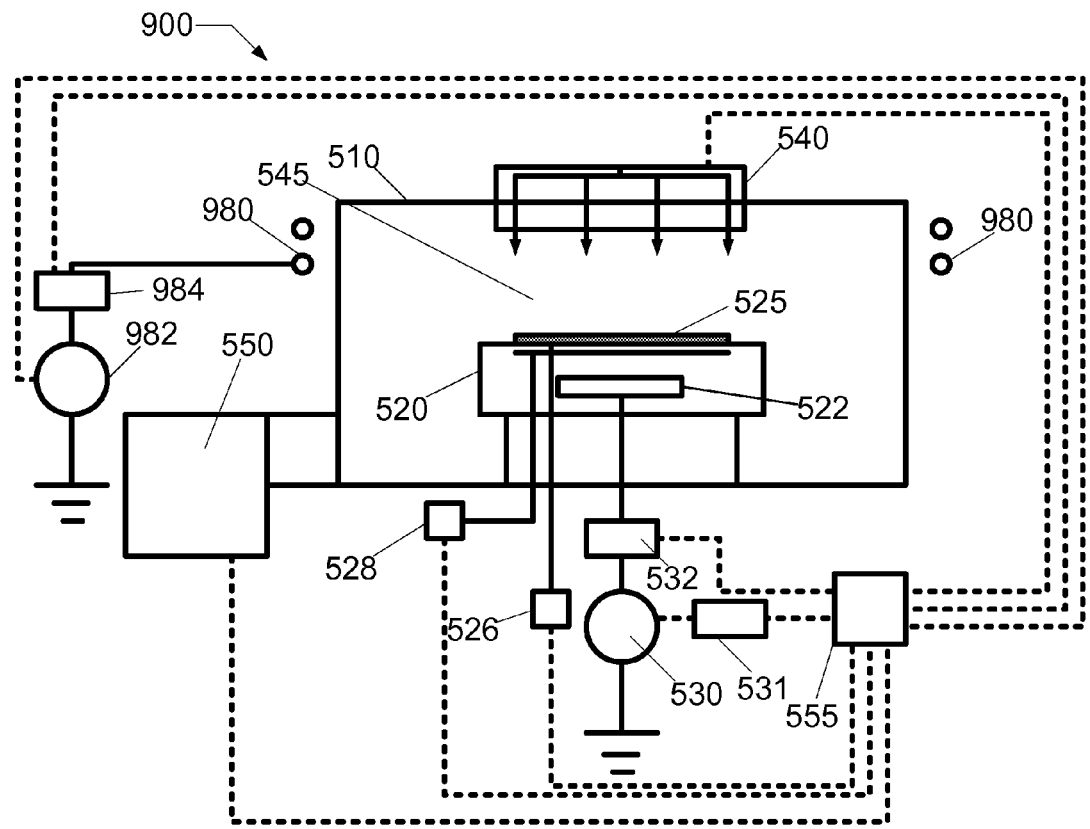
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100

MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
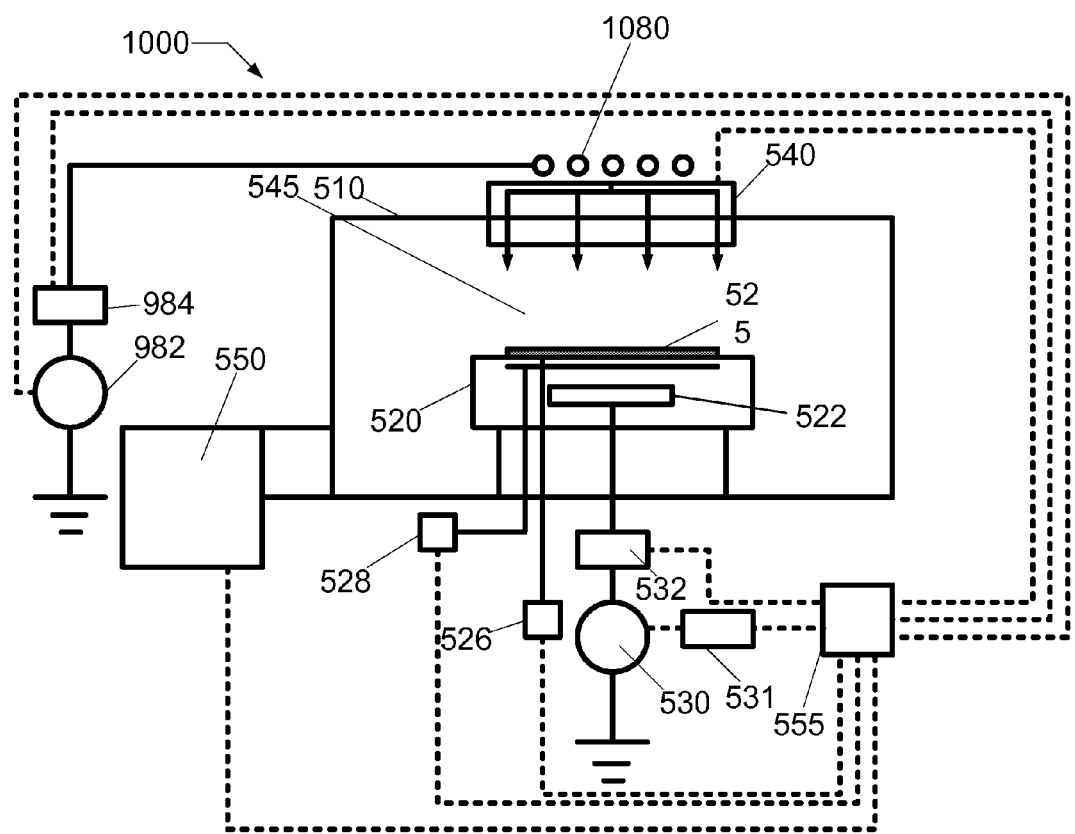
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
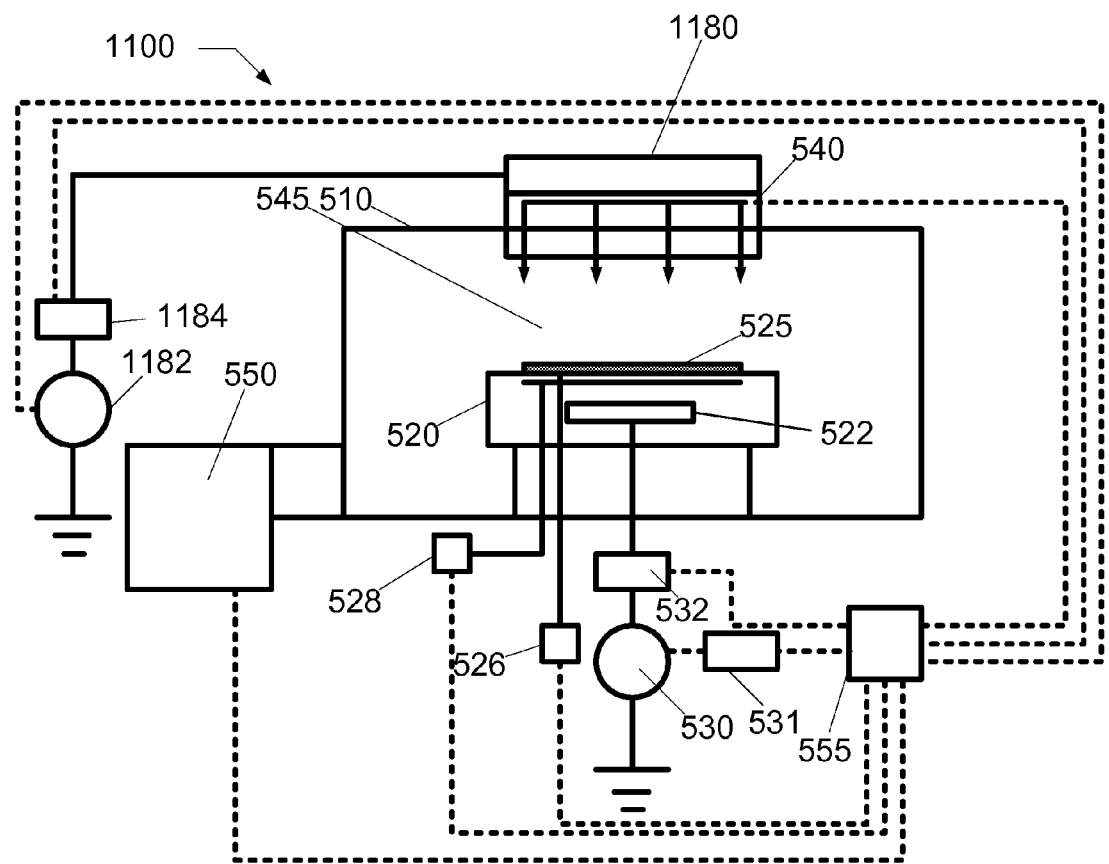
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1180. The SWP source 1180 can comprise a slot antenna, such as a radial line slot antenna, to which microwave power is coupled via microwave generator 1182 through optional impedance match network 1184.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of patterning a layer on a substrate, comprising:
disposing a substrate comprising a multi-layer mask in a plasma processing system, wherein the multi-layer mask has a patterned layer defining an open feature pattern overlying a silicon containing ARC (anti-reflective coating) layer;
establishing a flow of a process gas to the plasma processing system, the process gas containing:
a first gaseous molecular constituent composed of C, F and optionally H, and having a carbon-to-fluorine ratio of 1-to-4, and
a second gaseous molecular constituent composed of C, F, and optionally H, and having a carbon-to-fluorine ratio of 1-to-3,
selecting a process condition that adjusts the C—F molecular ratio to increase an etch selectivity, measured as the ratio of the etch rate of the silicon containing ARC layer to the etch rate of the patterned layer, to a value that exceeds 5-to-1 by selecting a ratio of the flow rate of the first gaseous molecular constituent to the flow rate of the second gaseous molecular constituent greater than or equal to 0.5 and less than 2.5;
igniting plasma from the process gas using a plasma source in accordance with the process condition; and
exposing the substrate to the plasma to extend the feature pattern of the patterned layer into the silicon containing ARC layer.

2. The method of claim 1, wherein the first gaseous molecular constituent includes $CF_4$.

3. The method of claim 2, wherein the second gaseous molecular constituent includes $CHF_3$.

4. The method of claim 3, wherein the process gas contains $CF_4$ and $CHF_3$, and the ratio of the $CF_4$ flow rate to the $CHF_3$ flow rate ranges from 0.5 to 2.0.

5. The method of claim 1, wherein the first gaseous molecular constituent includes $CF_4$, the second gaseous molecular constituent includes $OH F_3$, and the molecular ratio of carbon-to-fluorine for the combined flows of the process gas ranges from 0.274 to 0.300.

6. The method of claim 1, wherein the introducing of the process gas further includes introducing:
a third gaseous molecular constituent composed of atomic hydrogen, diatomic hydrogen, or C and an element selected from the group consisting of H and F, wherein the carbon-to-fluorine ratio of the third gaseous molecular constituent is greater than the maximum carbon-to-fluorine ratio of the first and second gaseous molecular constituents.

7. The method of claim 6, wherein the third gaseous molecular constituent includes a $C_xF_y$-containing gas, and wherein x and y represent a real number greater than 0.

8. The method of claim 7, wherein the ratio x/y exceeds the C-to-F ratio of the first and the second gaseous molecular constituents.

9. The method of claim 7, wherein the third gaseous molecular constituent includes a $C_4F_8$.

10. The method of claim 6, wherein the third gaseous molecular constituent includes a $C_xH_y$-containing gas, and wherein x and y represent a real number greater than 0.

11. The method of claim 10, wherein the ratio y/x exceeds the H-to-C ratio of the first and the second gaseous molecular constituents.

12. The method of claim 10, wherein the $C_xH_y$-containing gas includes $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof.

13. The method of claim 1, further comprising:
pulse modulating the introducing of the second gaseous molecular constituent.

14. The method of claim 13, further comprising:
selecting a process condition for the pulse modulating and controlling a profile of the open feature pattern formed within the silicon containing ARC layer, the process condition including setting a pulse amplitude, a pulse frequency, a pulse duty cycle, or a pulse waveform, or any combination thereof.

15. The method of claim 13, wherein the pulse modulating comprises pulsing the flow rate of the second gaseous molecular constituent between an off-state and an on-state.

16. The method of claim 1, further comprising:
selecting a process condition that includes setting a flow rate of the second gaseous molecular constituent to decrease a roughness of the open feature pattern formed in the patterned layer and the silicon containing ARC layer relative to a nominal roughness achievable using the process condition while introducing only the primary etchant gas composition.

17. The method of claim 16, wherein the reduction of roughness exceeds 10% of the nominal roughness.

18. The method of claim 1, further comprising:
electrically biasing a substrate holder that supports the substrate with radio frequency (RF) power; and
pulsing the RF power for the electrical biasing.

19. The method of claim 1, wherein the etch selectivity exceeds a value of 10.

20. The method of claim 1, wherein the patterned layer has an open feature pattern characterized by a first critical dimension (CD), and wherein a difference between a second CD measured at a bottom of the open feature pattern formed in the silicon containing ARC layer and the first CD is less than 20% of the first CD.

* * * * *

UNITED STATES PATENT AND TRADEMARK OFFICE
CERTIFICATE OF CORRECTION

PATENT NO. : 9,607,843 B2  Page 1 of 1
APPLICATION NO. : 14/751643
DATED : March 28, 2017
INVENTOR(S) : Vinayak Rastogi et al.

It is certified that error appears in the above-identified patent and that said Letters Patent is hereby corrected as shown below:

In the Specification

In Column 1, Lines 51-52, "methodologies, present" should read --methodologies present--.

In Column 1, Line 53, "with low resist budget'," should read --with 'low resist budget',--.

In Column 3, Line 27, "with low resist budget'," should read --with 'low resist budget',--.

In Column 8, Line 4, "a moderate molar ratios," should read --a moderate molar ratio,--.

In Column 16, Line 16, "upper electrode is well" should read --upper electrode are well--.

In Column 17, Lines 14-15, "is well known" should read --are well known--.

In the Claims

In Column 18, Line 8, Claim 5, "OH $F_3$," should read --$CHF_3$,--.

In Column 18, Line 28, Claim 9, "includes a $C_4F_8$." should read --includes $C_4F_8$.--.

Signed and Sealed this
Twentieth Day of June, 2017

Joseph Matal
*Performing the Functions and Duties of the
Under Secretary of Commerce for Intellectual Property and
Director of the United States Patent and Trademark Office*